(12) United States Patent
Kim

(10) Patent No.: US 11,658,795 B2
(45) Date of Patent: May 23, 2023

(54) CLOCK AND DATA RECOVERY CIRCUIT AND RECEIVER

(71) Applicant: MegaChips Corporation, Osaka (JP)

(72) Inventor: Yongwi Kim, Chiba (JP)

(73) Assignee: MEGACHIPS CORPORATION, Osaka (JP)

( * ) Notice: Subject to any disclaimer, the term of this patent is extended or adjusted under 35 U.S.C. 154(b) by 0 days.

(21) Appl. No.: 17/569,502

(22) Filed: Jan. 6, 2022

(65) Prior Publication Data

US 2022/0216979 A1 Jul. 7, 2022

(30) Foreign Application Priority Data

Jan. 7, 2021 (JP) .............................. JP2021-001539

(51) Int. Cl.
| | |
|---|---|
| *H03D 3/24* | (2006.01) |
| *H04L 7/00* | (2006.01) |
| *H03L 7/08* | (2006.01) |
| *H03K 5/13* | (2014.01) |
| *H03L 7/093* | (2006.01) |
| *H03K 5/00* | (2006.01) |

(52) U.S. Cl.
CPC .............. *H04L 7/0025* (2013.01); *H03K 5/13* (2013.01); *H03L 7/0807* (2013.01); *H03L 7/093* (2013.01); *H03K 2005/00052* (2013.01)

(58) Field of Classification Search
CPC . H04L 7/0025; H04L 25/4917; H04L 7/0033; H04L 7/033; H04L 7/0337; H03L 7/0807; H03L 7/093; H03L 7/0891; H03K 5/13; H03K 2005/00052; G06F 1/10
USPC ................................. 375/375–376, 327, 294
See application file for complete search history.

(56) References Cited

U.S. PATENT DOCUMENTS

| | | |
|---|---|---|
| 7,489,749 B2 | 2/2009 | Liu |
| 8,130,888 B2 | 3/2012 | Eldredge et al. |
| 8,693,596 B1 | 4/2014 | Warner et al. |
| 8,942,334 B1 | 1/2015 | Zortea et al. |
| 8,989,333 B2 | 3/2015 | Hashida et al. |
| 9,264,219 B1* | 2/2016 | Kang ...................... H03L 7/093 |
| 11,018,842 B1* | 5/2021 | Bellorado ............. H04L 7/0033 |
| 11,070,351 B1* | 7/2021 | Chepuri .............. H04L 25/4917 |

(Continued)

FOREIGN PATENT DOCUMENTS

JP 2020-120214 A 8/2020

OTHER PUBLICATIONS

"Figure 24—Uploaded by Nader Bagherzadeh", Available Online at:https://www.researchgate.net/figure/S-Curve-of-the-Full-Precision-PhaseDetector-2-and-sent-to-the-loop-lter-These-extra_fig9_228580005, May 1997, 1 page.

Schmitz, "Phase Detectors", Available Online at:https://cnx.org/contents/kvgt06Nh@7/Phase-Detectors, Feb. 28, 2007, 6 pages.

(Continued)

*Primary Examiner* — Phuong Phu
(74) *Attorney, Agent, or Firm* — Xsensus LLP

(57) ABSTRACT

A clock and data recovery circuit includes a phase detector that outputs phase characteristic data based on a digital data signal and an adjustment circuit that adjusts phase characteristic data. The clock and data recovery circuit sets an adjustment value in an adjustment circuit by calculating an adjustment value of phase characteristic data using a monitor circuit while changing a phase of a reference clock signal to be adjusted in a phase interpolation circuit based on offset data output from an offset output circuit in a training period before communication starts.

8 Claims, 6 Drawing Sheets

(56) References Cited

U.S. PATENT DOCUMENTS

| | | | |
|---|---|---|---|
| 2007/0183553 A1* | 8/2007 | Sanders | H04L 7/033 375/376 |
| 2009/0225917 A1* | 9/2009 | Takagi | H04L 7/0337 375/359 |
| 2010/0241918 A1* | 9/2010 | Nedovic | H03L 7/0891 714/E11.023 |
| 2012/0213265 A1* | 8/2012 | Wu | H03L 7/0807 375/226 |
| 2013/0243107 A1 | 9/2013 | Chmelar et al. | |
| 2015/0188551 A1* | 7/2015 | Aziz | H04L 7/033 375/375 |
| 2021/0273642 A1* | 9/2021 | Wu | G06F 1/10 |
| 2022/0150043 A1* | 5/2022 | Kim | H04L 7/0025 |

OTHER PUBLICATIONS

Metref et al., "S-curve Theoretical Analysis of a Classical and a Hierarchical Phase Detector for QAM Constellations", IEEE International Symposium on Signal Processing and Information Technology, 2007, pp. 469-473.

Jayaraj, "Minimum Symbol Error Rate Timing Recovery System", All Graduate Theses and Dissertations, 2010, 45 pages.

Palermo, "ECEN689: Special Topics in High-Speed Links Circuits and Systems Spring 2010", 2010, 21 pages.

Walker, "Clock and Data Recovery for Serial Digital Communication—focusing on bang-bang loop CDR design methodology ISSCC Short Course", Feb. 2002, 79 pages.

Sommer, "Timing Recovery of PAM Signals Using Baud Rate Interpolation", Available Online at:https://ieeexplore.ieee.org/document/1399690, 2004, 1 page.

* cited by examiner

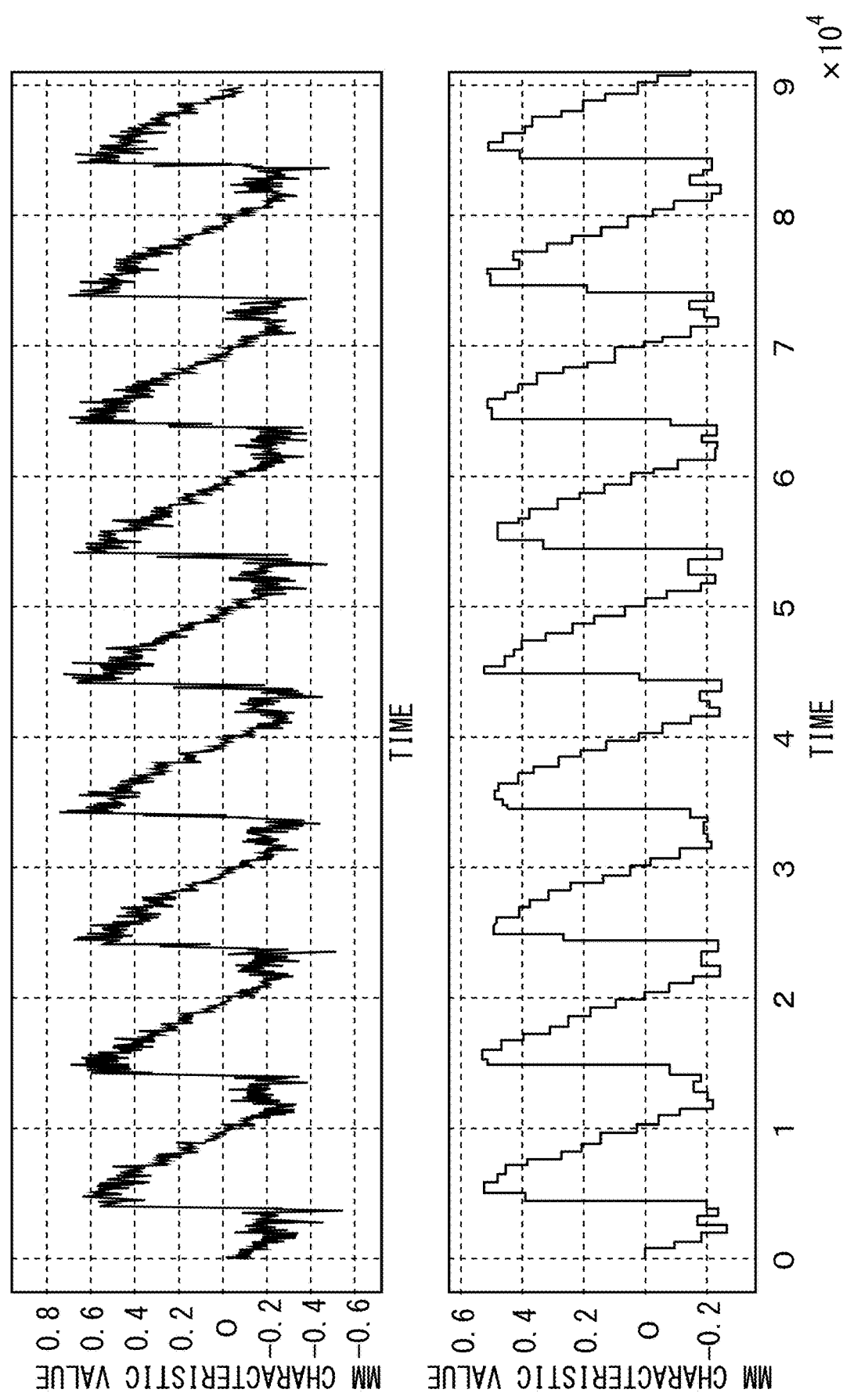

CLOCK AND DATA RECOVERY CIRCUIT AND RECEIVER

CROSS-REFERENCE TO RELATED APPLICATION

This application claims priority to Japanese Application No. 2021-001539, filed Jan. 7, 2021, the entire contents of which are incorporated herein by reference.

BACKGROUND

Technical Field

The present invention relates to a circuit that recovers a clock signal for sampling received data and a receiver including the circuit.

Description of Related Art

In a communication system, it is necessary to establish synchronization in frequencies and phases of clock signals between a transmitter and a receiver. A clock and data recovery circuit (CDR circuit) included in the receiver recovers a clock signal based on a random data signal transmitted from the transmitter. An analog-to-digital converter included in the receiver samples a data signal based on the clock signal recovered by the CDR circuit.

A clock recovery circuit of JP 2020-120214 A calculates a phase difference between input data and a recovery clock using a clock signal and a clock signal that is inverted by 180 degrees from the clock signal. In addition, a method of calculating a phase difference between a transmitter-side clock signal and a receiver-side clock signal using a double oversampled clock signal is proposed.

SUMMARY

However, a higher manufacturing cost is required to configure an analog circuit that calculates the phase difference between the transmitter-side clock signal and the receiver-side clock signal using the double oversampled clock signal or the clock signal whose phase is inverted by 180 degrees. As such, a phase detector that digitally executes a process of acquiring a phase difference between input data and recovery clock may be used. As a phase detector, a Mueller-Muller phase detector has been known, for example.

The phase detector is a circuit that detects a phase difference from a received data sequence, and its detection result depends on the quality of received data. That is, a result of detection by the phase detector is influenced by channel characteristics. Therefore, a frequency lock may not be possible in a receiver depending on channel characteristics.

An object of the present invention is to recover a clock signal based on a received data signal with an effect of channel characteristics reduced.

A clock and data recovery circuit according to one aspect of the present invention includes a phase interpolation circuit that adjusts a phase of a reference clock signal generated by a reference clock generation circuit and generates a reception clock signal, a phase detector that inputs a reception digital data signal output from an analog-to-digital converter, that operates in synchronization with the reception clock signal generated in the phase interpolation circuit and converts a reception analog data signal into the reception digital data signal, and outputs phase characteristic data based on the reception digital data signal, an adjustment circuit that adjusts the phase characteristic data, a monitor circuit that monitors the phase characteristic data output from the adjustment circuit and calculates an adjustment value to be set in the adjustment circuit based on the phase characteristic data, a loop filter that outputs adjustment data for generating phase data to be set in the phase interpolation circuit based on the phase characteristic data output from the adjustment circuit, and an offset output circuit that outputs offset data for generating the phase data to be set in the phase interpolation circuit, wherein the clock and data recovery circuit sets the adjustment value in the adjustment circuit by calculating the adjustment value using the monitor circuit while changing a phase of the reference clock signal to be adjusted in the phase interpolation circuit based on the offset data output from the offset output circuit, in a training period before communication starts.

A receiver according to another aspect of the present invention includes the above-mentioned clock and data recovery circuit, the reference clock recovery circuit, and the analogue-to-digital converter.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 7 is a diagram showing the MM output.

DETAILED DESCRIPTION

A dock and data recovery circuit according to embodiments of the present invention will now be described with reference to the attached drawings.

(1) Configuration of Communication System

Figure 1:
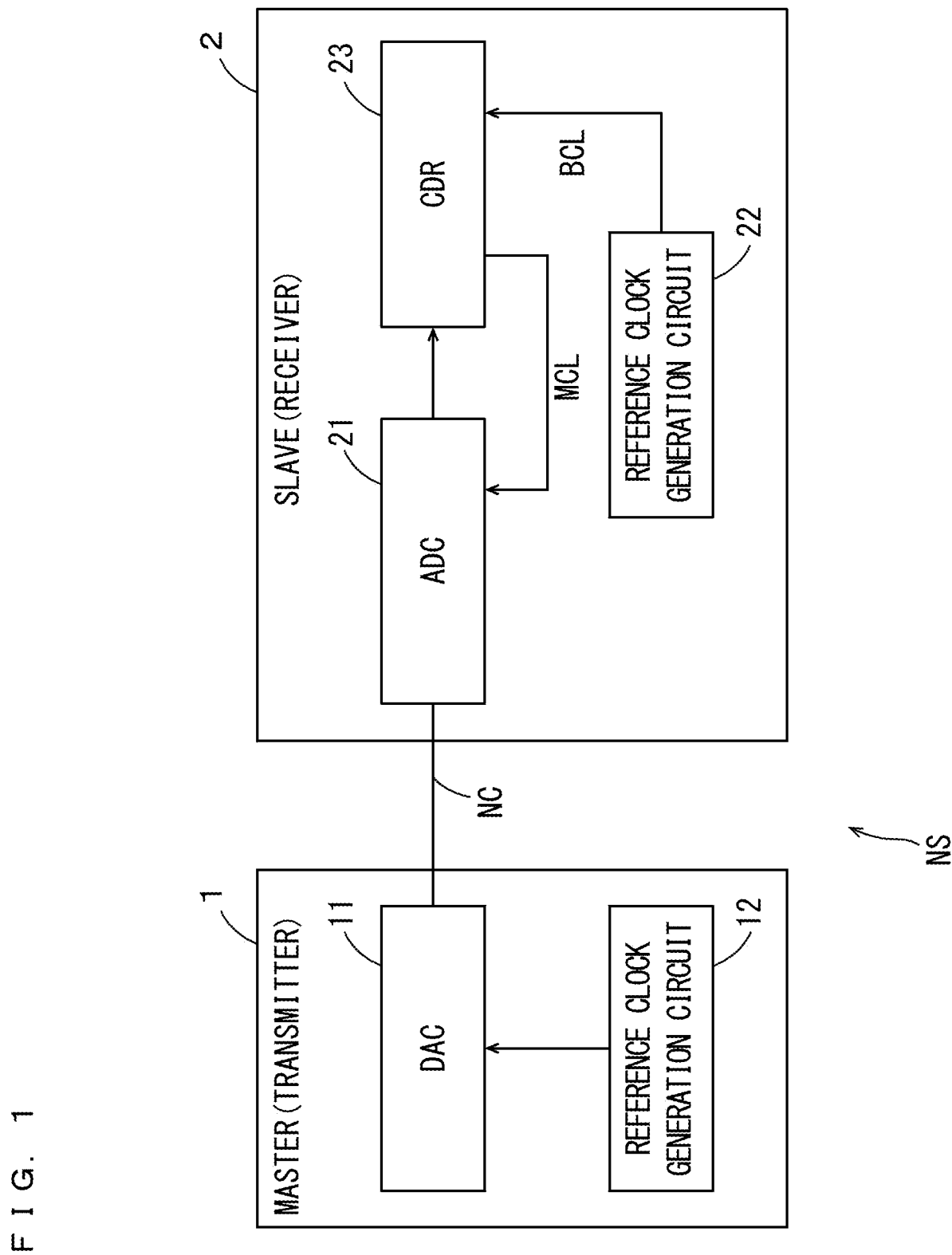
FIG. 1 is an overall view of a communication system.

FIG. 1 is an overall view of a communication system NS. The communication system NS includes a master 1 and a slave 2. The master 1 and the slave 2 are connected through a communication line NC. That is, in the present embodiment, the master 1 and the slave 2 carry out high speed wired communication. The master 1 and the slave 2 may be installed in the same facility or may be installed in different facilities. Alternatively, the master 1 and the slave 2 may be Installed in a vehicle such as an automobile. The master 1 and the slave 2 carry out communication utilizing TCP/IP, for example. In this embodiment, the master 1 operates as a transmitter and the slave 2 operates as a receiver, by way of example. Therefore, the master 1 as a transmitter 1 and the slave 2 as a receiver 2 will be described below. It is noted that each device (each terminal) may include functions as both of the master 1 and the slave 2 which will be described in the embodiment provided below. That is, each device (each terminal) may function as a transmitter and a receiver.

The transmitter 1 includes a digital-to-analog converter (DAC) 11 and a reference clock generation circuit 12. The digital-to-analog converter 11 converts a data signal to be transmitted into an analog signal based on a reference clock signal generated by the reference clock generation circuit 12, to output the analog converted data signal to the communication line NC. The reference clock generation circuit 12 is constituted by a crystal oscillator or a PLL (Phase Lock Loop) circuit, for example.

The receiver 2 includes an analog-to-digital converter (ADC) 21, a reference clock generation circuit 22, and the clock and data recovery circuit (CDR circuit) 23. The analog-to-digital converter 21 digitally converts the data signal received through the communication line NC utilizing a reception clock signal MCL generated in the clock and data recovery circuit 23. The reference clock generation circuit 22 is constituted by a crystal oscillator or a PLL (Phase Lock Loop) circuit, for example, and generates a reference clock signal BCL. The clock and data recovery circuit 23 adjusts a phase of the reference clock signal BCL based on the digital converted data signal to generate the reception clock signal MCL.

(2) Configuration of Receiver Including Clock and Data Recovery Circuit

Figure 2:
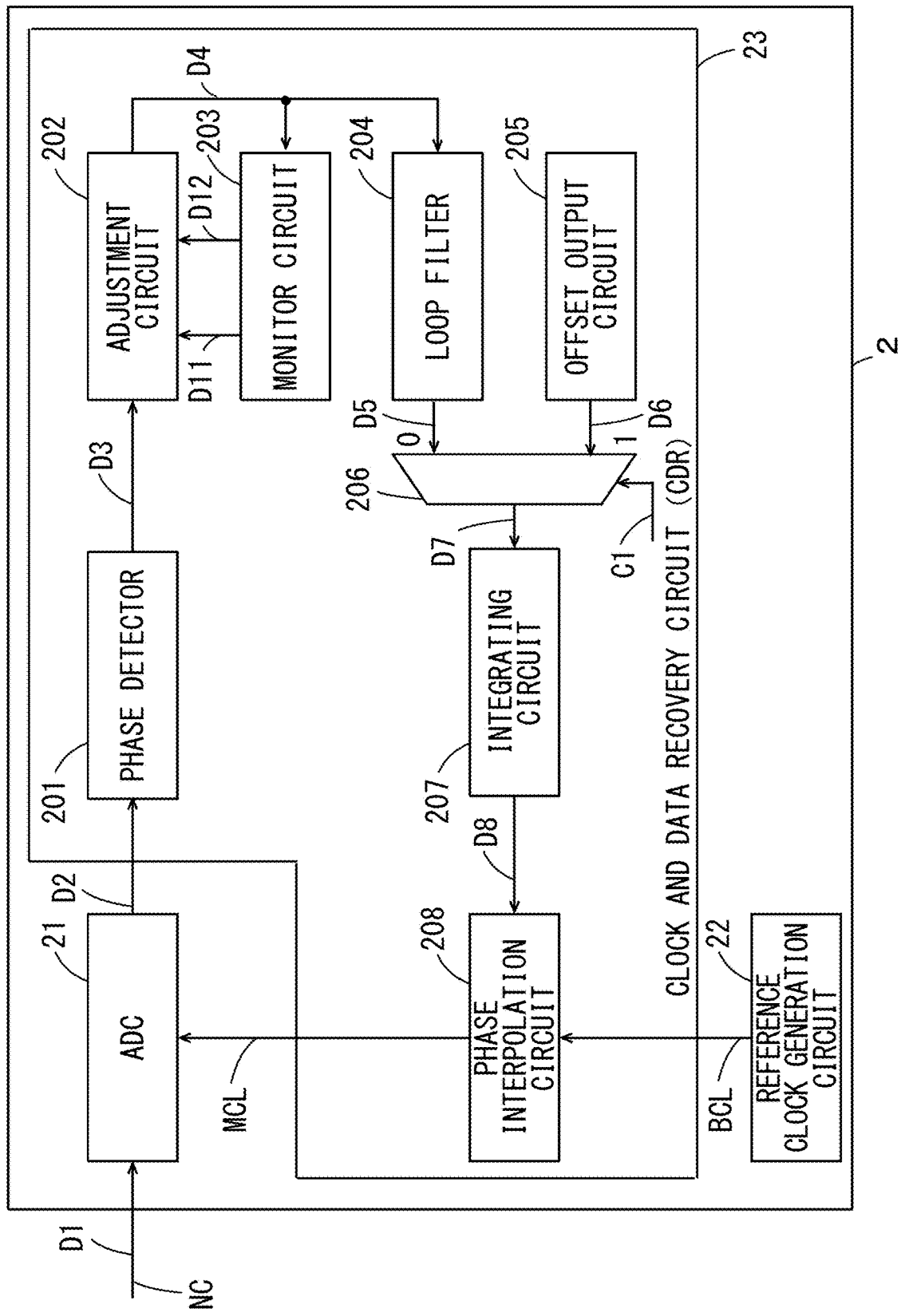
FIG. 2 is a block diagram of a receiver showing an internal configuration of a clock and data recovery circuit according to the present embodiment.

FIG. 2 is a block diagram of the receiver 2 showing an internal configuration of the clock and data recovery circuit 23. As shown in FIG. 1, the receiver 2 includes the analog-to-digital converter 21, the reference clock generation circuit 22, and the clock and data recovery circuit 23.

The analog-to-digital converter 21 converts an analog data signal D1 received through the communication line NC into a digital data signal D2. The analog-to-digital converter 21 samples the data signal D2 based on a reception clock signal MCL generated by a phase interpolation circuit 208. The reference clock generation circuit 22 generates a reference clock signal BCL. The phase interpolation circuit 208 inputs the reference clock signal BCL output from the reference clock generation circuit 22. The phase interpolation circuit 208 adjusts the phase of the reference clock signal BCL based on phase data D8 generated by the clock and data recovery circuit 23, to generate the reception clock signal MCL.

As shown in FIG. 2, the clock and data recovery circuit 23 includes a phase detector 201, an adjustment circuit 202, a monitor circuit 203, a loop filter 204, an offset output circuit 205, a selector 206, an integrating circuit 207 and the phase interpolation circuit 208.

The phase detector 201 receives the digital data signal D2 output from the analog-to-digital converter 21. The phase detector 201 calculates phase characteristic data D3 based on the data signal D2. In the present embodiment, a Mueller-Muller phase detector is used as the phase detector 201, by way of example. The phase detector 201 outputs a Mueller-Muller characteristic value (hereinafter referred to as an MM characteristic value) as the phase characteristic data D3 based on the data signal D2.

Figure 5:
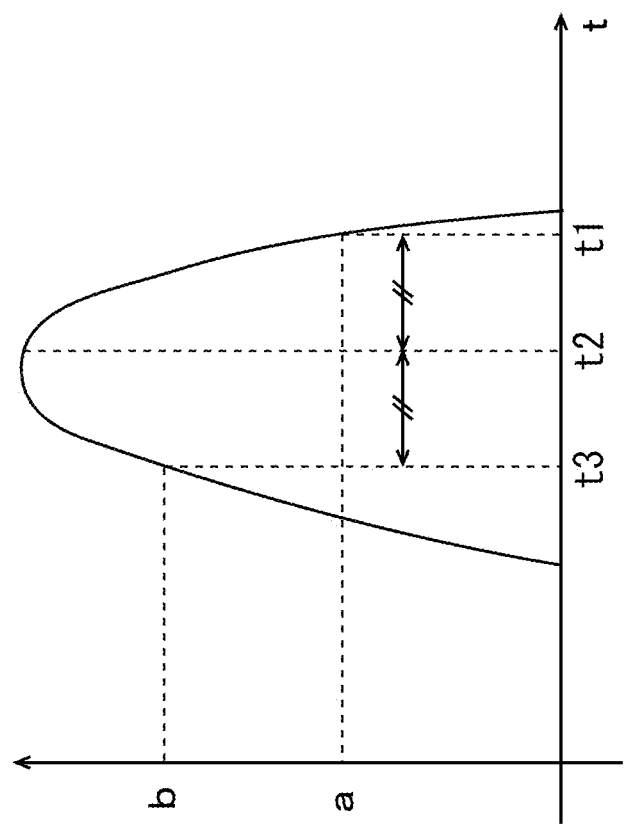
FIG. 5 is a diagram for explaining an MM characteristic value.

FIG. 5 is a diagram for explaining an MM characteristic value (Impulse response of channel). In FIG. 5, the abscissa indicates the time, and the ordinate indicates a signal value of the data signal D2. A point t2 in time in the diagram indicates a sampling point. Further, points t1, t3 in time are points in time before and after the sampling point t2, and the time interval between t1 and t2 and the time interval between t2 and t3 are the same. The value of the data signal D2 at the point t1 in time is "a," and the value of the data signal D2 at the point t3 in time is "b." The MM characteristic value is proportional to b−a. In a case where b−a=0, the MM characteristic value is 0. That is, as the sampling point t2 deviates from the peak of the data signal D2, the MM characteristic value is increased.

As shown in FIG. 2, the adjustment circuit 202 receives the phase characteristic date D3 (MM characteristic value) output by the phase detector 201. The adjustment circuit 202 is a circuit for adjusting the offset and gain of the phase characteristic data D3.

Figure 3:
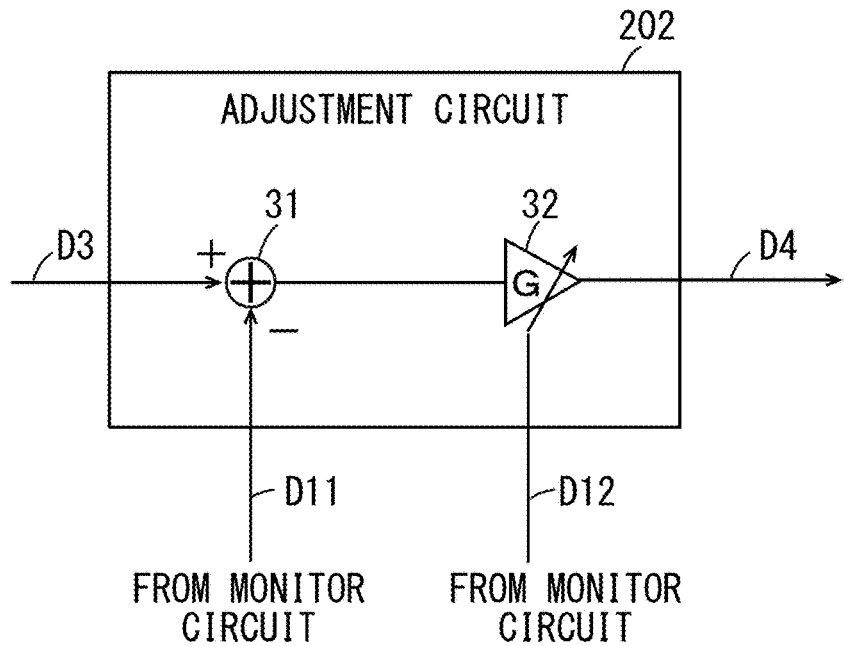
FIG. 3 is a circuit diagram of an adjustment circuit according to the present embodiment.

FIG. 3 is a circuit diagram showing the adjustment circuit 202. The adjustment circuit 202 includes an adder 31 and a multiplier 32. The adder 31 receives the phase characteristic data D3 output by the phase detector 201. Further, the adder 31 receives average value data D11 output by the monitor circuit 203. The adder 31 outputs subtraction data by subtracting the average value data D11 from the phase characteristic data D3. The average value data D11 is utilized as an offset adjustment value for the phase characteristic data D3. The subtraction data is data obtained when the offset of the phase characteristic data D3 is adjusted.

The multiplier 32 receives the subtraction data output by the adder 31. Further, the multiplier 32 receives gain adjustment data D12 output by the monitor circuit 203. The multiplier 32 outputs phase characteristic data D4 by multiplying the subtraction data by the gain adjustment data D12. The gain adjustment data D12 is utilized as a gain adjustment value for the phase characteristic data D3. The phase characteristic data D4 is data obtained when the offset and gain of the phase characteristic data D3 are adjusted. That is, the phase characteristic data D4 is an MM characteristic value the offset and gain of which are adjusted.

As shown in FIG. 2, the monitor circuit 203 receives the phase characteristic data D4 output by the adjustment circuit 202. The monitor circuit 203 is a circuit that operates in a training period before communication starts.

Figure 4:
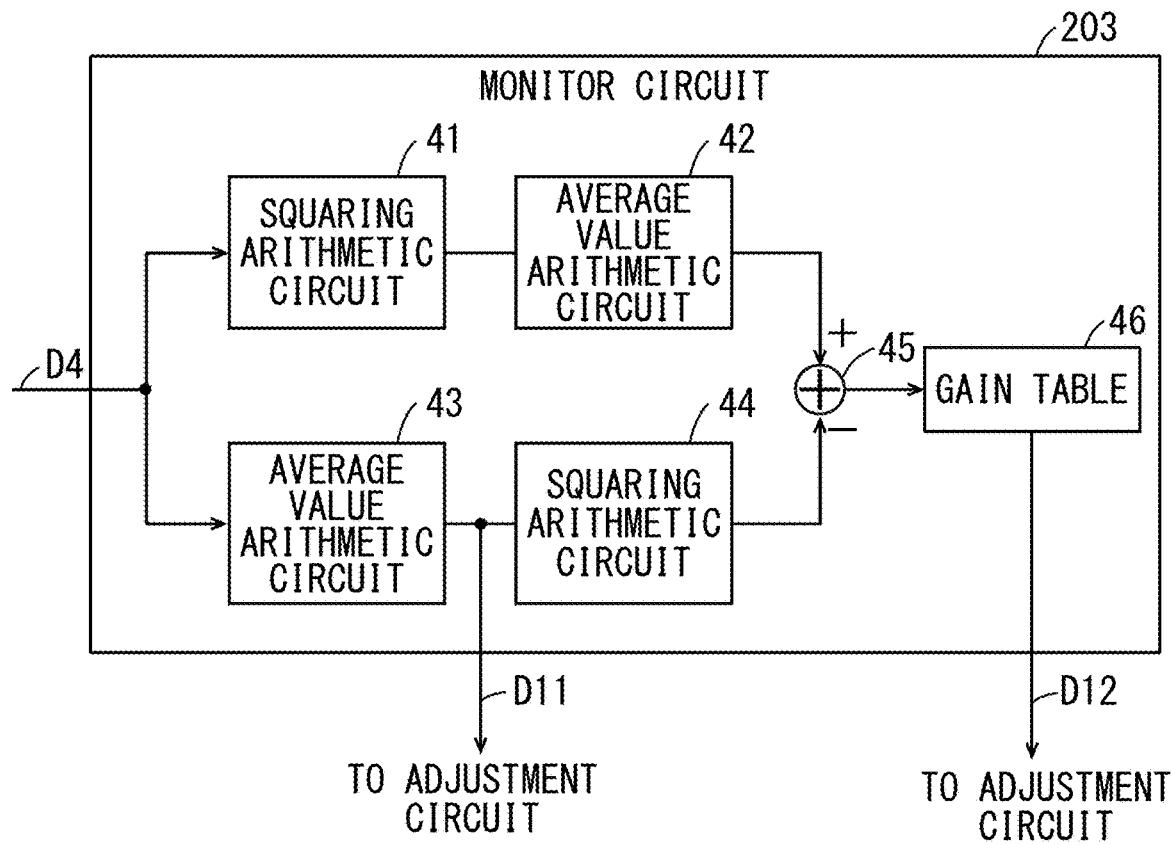
FIG. 4 is a circuit diagram of a monitor circuit according to the present embodiment.

FIG. 4 is a circuit diagram showing the monitor circuit 203. The monitor circuit 203 includes a squaring arithmetic circuit 41, an average value arithmetic circuit 42, an average value arithmetic circuit 43, a squaring arithmetic circuit 44, an adder 45 and a gain table 48. The squaring arithmetic circuit 41 receives the phase characteristic data D4 output by the adjustment circuit 202. The squaring arithmetic circuit 41 squares a value of the phase characteristic data D4. The average value arithmetic circuit 42 accumulates arithmetic results provided by the squaring arithmetic circuit 41 in a predetermined period and calculates the average value.

The average value arithmetic circuit 43 receives the phase characteristic data D4 output by the adjustment circuit 202. The average value arithmetic circuit 43 accumulates the phase characteristic data D4 in a predetermined period and calculates the average value. The squaring arithmetic circuit 44 squares the average value output from the average value arithmetic circuit 43. The average value calculated by the average value arithmetic circuit 43 is supplied to the adjustment circuit 202 as the average value data D11.

The adder 45 receives the output of the average value arithmetic circuit 42 and the output of the squaring arithmetic circuit 44. The adder 45 subtracts an output value of the squaring arithmetic circuit 44 from an output value of the average value arithmetic circuit 42 and acquires a variance value of the phase characteristic data D4. The gain table 46 is a table that associates the variance value of the phase characteristic data D4 with the gain adjustment data D12. The gain table 46 receives the variance value output from the adder 45 and outputs the corresponding gain adjustment data D12. The gain adjustment data D12 is supplied to the adjustment circuit 202.

As shown in FIG. 2, the loop filter 204 receives the phase characteristic data D4 output by the adjustment circuit 202. The loop filter 204 includes an averaging circuit and an integrating circuit. The loop filter 204 performs averaging processing on the phase characteristic data D4 in the averaging circuit. The loop filter 204 integrates the phase characteristic data D4 subjected to the averaging processing in the integrating circuit, to calculate the adjustment data D5. The loop filter 204 supplies the adjustment data D5 to the selector 206.

The offset output circuit 205 is a circuit that operates in the training period before communication starts. The offset output circuit 205 supplies offset data D6 to the selector 206. The selector 206 receives a control signal C1 from a control device (not shown). The selector 206 outputs the adjustment data D5 supplied from the loop filter 204 as adjustment data D7 when receiving "0" as the control signal C1. The selector 206 outputs the offset data D6 supplied from the offset output circuit 205 as the adjustment data D7 when receiving "1" as the control signal C1.

The integrating circuit 207 integrates the adjustment data D7 output from the selector 206 and outputs the phase data D8. The integrating circuit 207 supplies the phase data D8 to the phase interpolation circuit 208.

The phase interpolation circuit 208 receives the phase data D8 output from the integrating circuit 207. The phase interpolation circuit 208 adjusts the phase of the reference clock signal BCL based on the phase data D8 and generates the reception clock signal MCL. The phase interpolation circuit 208 supplies the reception clock signal MCL to the analog-to-digital converter 21. Suppose that the phase of the reception clock signal MCL output from the phase interpolation circuit 208 is adjusted at an angular frequency ω, for example. At this time, letting the offset data D6 be a, and letting a sample interval be Ts, $\Omega=\omega*Ts$ holds. Ω is added for each sample in the integrating circuit 207, so that a value integrated in the integrating circuit 207 in one second is w.

(3) Operation in Training Period

The operation in the training period before communication is started by the above-mentioned clock and data recovery circuit 23 will be described. In the training period, "1" is supplied as a control signal C1 to the selector 206 shown in FIG. 2. The selector 206 supplies the offset data D6 output from the offset output circuit 205 as the adjustment data D7 to the integrating circuit 207. The integrating circuit 207 integrates the adjustment data D7 and supplies the phase data D8 to the phase interpolation circuit 208. Thus, the phase interpolation circuit 208 sequentially receives the phase data D8 the value of which increases gradually while the adjustment data D7 is added. In response, the phase interpolation circuit 208 sequentially adjusts the phase of the reference clock signal BCL based on the phase data D8. The phase interpolation circuit 208 outputs the reception clock signal MCL the phase of which changes sequentially. The analog-to-digital converter 21 converts a data signal D1 into a digital signal in synchronization with the reception clock signal MCL the phase of which changes sequentially, to output a data signal D2.

Figure 6:
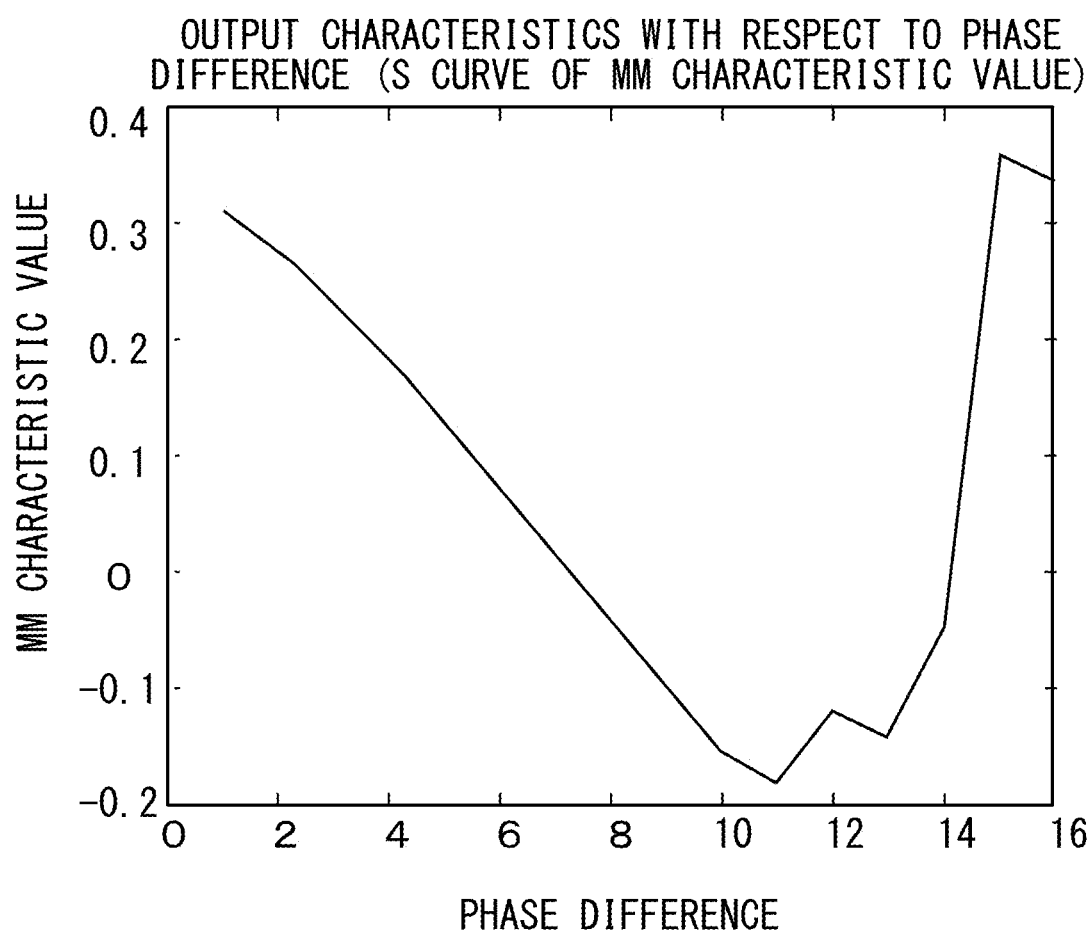
FIG. 6 is a diagram showing an S curve of MM output.

The phase detector 201 receives the data signal D2 output by the analog-to-digital converter 21. The phase detector 201 outputs phase characteristic data D3 (an MM characteristic value) based on the data signal D2. The phase detector 201 outputs the phase characteristic data D3 (MM characteristic value) corresponding to the reception clock signal MCL the phase of which changes sequentially. FIG. 6 is a graph showing the output characteristics of the MM characteristic value with respect to a phase difference. The output characteristics of the MM characteristic value with respect to the phase difference is referred to as an S curve of the MM characteristic value. In FIG. 6, the abscissa indicates the phase difference, and the ordinate indicates the MM characteristic value. In the example shown in FIG. 6, in regard to the MM characteristic value, its maximum value is about 0.3, and its minimum value is about −0.2. The MM characteristic value is offset to the positive side. That is, in the example of FIG. 6, the MM characteristics are offset to the positive side due to the channel characteristics.

The adjustment circuit 202 receives the phase characteristic data D3 output by the phase detector 201. As shown in FIG. 3, the adjustment circuit 202 adjusts the offset of the phase characteristic data D3 using the average value data D11 received from the monitor circuit 203. Further, the adjustment circuit 202 adjusts the gain of the phase characteristic data D3 using the gain adjustment data D12 received from the monitor circuit 203. For example, at the start point in time of the training period, the offset (the average value data D11) is set to "0," and the gain (the gain adjustment data D12) is set to "1."

Next, the monitor circuit 203 receives the phase characteristic data D4 the offset and gain of which are adjusted. As shown in FIG. 4, the monitor circuit 203 generates the average value data D11 and the gain adjustment data D12 based on the phase characteristic data D4. The generated average value data D11 and the generated gain adjustment data D12 are supplied to the adjustment circuit 202, and the offset and gain of the phase characteristic data 4 are adjusted. In this manner, in the training period, the adjustment circuit 202 and the monitor circuit 203 adjust the offset and gain of the phase characteristic data D3 by acquiring the output characteristics of the phase characteristic data D3 with respect to the phase difference (the S curve of the MM characteristic value in this example). Thus, the phase characteristic data D3 can be adjusted in the training period in accordance with the channel characteristics. When the training period ends, the offset (the average value data D11) and the gain (the gain adjustment data D12) set in the adjustment circuit 202 are locked.

FIG. 7 is a diagram showing the MM characteristic value output by the phase detector 201. In FIG. 7, the abscissa indicates the time, and the ordinate indicates the MM characteristic value. The upper diagram in FIG. 7 is a plot illustrating the average value of the MM characteristic value in regard to 40 samples. The lower diagram in FIG. 7 is a plot illustrating the average value of the MM characteristic value in regard to 640 samples. Also in the example of FIG. 7, the MM characteristic value is offset to the positive side due to channel characteristics. The monitor circuit 203 may acquire only one S curve shown in FIG. 6 to acquire the offset (the average value data D11) and the gain (the gain adjustment data D12). Alternatively, the monitor circuit 203 may acquire a plurality of S curves as shown in FIG. 7 to acquire their average value.

(4) Operation After Training

The operation after training by the clock and data recovery circuit 23 will be described. The phase detector 201 receives a data signal D2 output by the analog-to-digital converter 21. The phase detector 201 outputs phase characteristic data D3 (an MM characteristic value) based on the data signal D2. The adjustment circuit 202 receives the phase characteristic data D3 output by the phase detector 201. The adjustment circuit 202 adjusts the offset of the phase characteristic data D3 using average value data D11 locked in a training period. Further, the adjustment circuit 202 adjusts the gain of the phase characteristic data D3 using gain adjustment data D12 locked in the training period. After the end of the training period, the monitor circuit 203 is not utilized.

Next, the loop filter 204 receives phase characteristic data D4 the offset and gain of which are adjusted. The loop filter 204 performs averaging processing and integrating processing on the phase characteristic data D4 to output adjustment data D5. After the end of the training period, "0" is supplied to the selector 206 as a control signal C1. The selector 206 supplies the adjustment data D5 output from the loop filter 204 as adjustment data D7 to the integrating circuit 207. The integrating circuit 207 integrates the adjustment data D7 and supplies the phase data D8 to the phase interpolation circuit 208. In response, the phase interpolation circuit 208 adjusts the phase of a reference clock signal BCL based on the phase data D8 and outputs a reception clock signal MCL. The analog-to-digital converter 21 samples a data signal D1 based on the reception clock signal MCL to output a data signal D2.

In this manner, in the training period, the clock and data recovery circuit 23 of the present embodiment acquires output characteristics with respect to a phase difference (the S curve of the MM characteristic value in the above-mentioned example), and adjusts the offset and gain of the phase characteristic data D3 (MM characteristic value) in accordance with channel characteristics. Thus, the adjustment data D5 or the phase data D8 can be converged by the loop filter 204 that operates after the end of the training period, and a correct data signal D2 can be acquired in the analog-to-digital converter 21.

The phase detector 201 is a device that detects a phase difference from a transmission clock signal based on a signal data sequence, and operates non-linearly due to its poor linear characteristics. Further, since the loop characteristics of the S curve of the MM characteristic value are different for each channel, there is a problem that a phase locking range, phase noise and a lock time are different depending on a channel. In the present embodiment, because the output characteristics with respect to the phase difference (the S curve of the MM characteristic value in the above-mentioned example) are acquired in the training period, a phase Is locked correctly.

For example, in a case where it is assumed that a maximum difference in frequency between oscillators of the transmitter 1 and the receiver 2 is about ±100 ppm, the offset of about 200 ppm is desirably set based on the offset data D6 set in the offset output circuit 205. That is, the offset that is larger than a frequency difference between a transmitter and a receiver is desirably set. Thus, even in a case where an actual frequency difference is −100 ppm, with the offset of about +100 ppm, the phase of the reception clock signal MCL output from the phase interpolation circuit 208 can be changed in the training period.

(5) Other Embodiments

In the above-mentioned embodiment, an MM characteristic value is described as the phase characteristic data D3, by way of example. A Phase detector may be other means for detecting a phase difference between a reception clock signal MCL and a transmission clock signal than a Mueller Muller phase detector. Therefore, an S curve of an MM characteristic value monitored by the monitor circuit 203 is one example, and output characteristics with respect to a phase difference representing the relationship between the phase difference and the phase characteristic data D3 can be used.

In another embodiment, the offset data D6 output by the offset output circuit 205 can be variable. For example, the value of the offset date D6 may be freely set by a host CPU of the receiver 2 (slave), or the offset data D0 may be supplied by negotiation from the transmitter 1 (master). The transmitter 1 may transmit the offset data D6 to the receiver 2 by low-speed communication before high-speed communication starts.

Further, in another embodiment, the offset data D6 may be calculated based on an S curve of an MM characteristic value. For example, the offset data D6 may be calculated by calculation of a period of the S curve in the monitor circuit 203. In this case, the offset data D6 obtained by the monitor circuit 203 can be added to the output of the loop filter 204. In a normal state after a training period, the offset data D0 is added to the output of the loop filter 204 in advance, so that a phase is easily locked. By this operation, the output gain of the loop filter 204 can be lowered in the aim of reducing phase jitter as much as possible.

Further, in a case where communication is unstable, etc., a training period may be provided again. In this case, average value data D11 and gain adjustment data D12 used in a previous training period may be used as an initial setting.

(6) Aspects of Present Invention

<1> As described above, a clock and data recovery circuit according to the present embodiment includes a phase interpolation circuit that adjusts a phase of a reference clock signal generated by a reference clock generation circuit and generates a reception clock signal, a phase detector that inputs a reception digital data signal output from an analog-to-digital converter that operates in synchronization with the reception clock signal generated in the phase interpolation circuit and converts a reception analog data signal into the reception digital data signal, and outputs phase characteristic data based on the reception digital data signal, an adjustment circuit that adjusts the phase characteristic data, a monitor circuit that monitors the phase characteristic data output from the adjustment circuit and calculates an adjustment value to be set in the adjustment circuit based on the phase characteristic data, a loop filter that outputs adjustment data for generating phase data to be set in the phase interpolation circuit based on the phase characteristic data output from the adjustment circuit, and an offset output circuit that outputs offset data for generating the phase data to be set in the phase interpolation circuit. The clock and data recovery circuit sets the adjustment value in the adjustment circuit by calculating the adjustment value using the monitor circuit while changing a phase of the reference clock signal to be adjusted in the phase interpolation circuit based on the offset data output from the offset output circuit, in a training period before communication starts.

<2> The monitor circuit may calculate the adjustment value based on output characteristics with respect to a phase difference representing a relationship between a phase to be adjusted in the phase interpolation circuit in the training period and the phase characteristic data.

<3> The adjustment value may include an offset adjustment value and a gain adjustment value.

<4> The monitor circuit may calculate the gain adjustment value based on variance of the phase characteristic data.

<5> The monitor circuit may acquire the gain adjustment value by referring to a table that associates variance of the phase characteristic data with the gain adjustment value.

<6> The monitor circuit may calculate the offset adjustment value based on an average value of the phase characteristic data.

<7> The phase detector may be a Mueller-Muller phase detector, and the output characteristics with respect to a phase difference may be an S curve of Mueller-Muller output.

<8> A receiver according to the present embodiment includes the clock and date recovery circuit according to any one of the above-mentioned <1> to <7>, the reference clock generation circuit, and the analogue-to-digital converter.

The functionality of the elements disclosed herein may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

I claim:

1. A clock and data recovery circuit comprising:
    a phase interpolation circuit that adjusts a phase of a reference clock signal generated by a reference clock generation circuit and generates a reception clock signal;
    a phase detector that inputs a reception digital data signal output from an analog-to-digital converter, that operates in synchronization with the reception clock signal generated in the phase interpolation circuit and converts a reception analog data signal into the reception digital data signal, and outputs phase characteristic data based on the reception digital data signal;
    an adjustment circuit that adjusts the phase characteristic data;
    a monitor circuit that monitors the phase characteristic data output from the adjustment circuit and calculates an adjustment value to be set in the adjustment circuit based on the phase characteristic data;
    a loop filter that outputs adjustment data for generating phase data to be set in the phase interpolation circuit based on the phase characteristic data output from the adjustment circuit; and
    an offset output circuit that outputs offset data for generating the phase data to be set in the phase interpolation circuit, wherein
    the clock and data recovery circuit sets the adjustment value in the adjustment circuit by calculating the adjustment value using the monitor circuit while changing a phase of the reference clock signal to be adjusted in the phase interpolation circuit based on the offset data output from the offset output circuit, in a training period before communication starts.

2. The clock and data recovery circuit according to claim 1, wherein
    the monitor circuit calculates the adjustment value based on output characteristics with respect to a phase difference representing a relationship between a phase to be adjusted in the phase interpolation circuit in the training period and the phase characteristic data.

3. The clock and data recovery circuit according to claim 1, wherein
    the adjustment value includes an offset adjustment value and a gain adjustment value.

4. The clock and data recovery circuit according to claim 3, wherein
    the monitor circuit calculates the gain adjustment value based on variance of the phase characteristic data.

5. The clock and data recovery circuit according to claim 4, wherein
    the monitor circuit acquires the gain adjustment value by referring to a table that associates variance of the phase characteristic data with the gain adjustment value.

6. The clock and data recovery circuit according to claim 3, wherein
    the monitor circuit calculates the offset adjustment value based on an average value of the phase characteristic data.

7. The clock and data recovery circuit according to claim 2, wherein
    the phase detector is a Mueller-Muller phase detector, and the output characteristics with respect to a phase difference is an S curve of Mueller-Muller output.

8. A receiver comprising:
    the clock and data recovery circuit according to claim 1;
    the reference clock generation circuit; and
    the analogue-to-digital converter.

* * * * *